United States Patent [19]

Kanouda et al.

[11] Patent Number: 5,216,349

[45] Date of Patent: Jun. 1, 1993

[54] DRIVING CIRCUIT FOR A SWITCHING ELEMENT INCLUDING AN IMPROVED POWER SUPPLY ARRANGEMENT

[75] Inventors: Akihoko Kanouda; Hideki Miyazaki; Kozo Watanabe; Kenichi Onda; Yasuo Matsuda, all of Hitachi, Japan

[73] Assignee: Hitachi, Ltd., Tokyo, Japan

[21] Appl. No.: 734,127

[22] Filed: Jul. 25, 1991

Related U.S. Application Data

[63] Continuation of Ser. No. 405,233, Sep. 11, 1989, abandoned.

[30] Foreign Application Priority Data

Sep. 20, 1988 [JP] Japan .................................. 63-233431

[51] Int. Cl.$^5$ ............................................. H02M 7/52
[52] U.S. Cl. ..................................... 318/805; 318/798; 318/782; 363/131; 363/59
[58] Field of Search ............... 307/46, 43, 48; 363/41, 363/59, 138, 43, 132, 135, 136, 131; 318/727, 798, 254, 138, 805, 807, 782

[56] References Cited

U.S. PATENT DOCUMENTS

| | | | |
|---|---|---|---|
| 3,538,419 | 3/1969 | Seki et al. | 363/136 |
| 3,619,759 | 11/1971 | Seki | 363/136 |
| 3,628,126 | 12/1971 | Kawakami et al. | 363/135 |
| 4,050,005 | 9/1977 | Maginness | 363/59 |

Primary Examiner—William M. Shoop, Jr.
Assistant Examiner—John W. Cabeca
Attorney, Agent, or Firm—Antonelli, Terry, Stout & Kraus

[57] ABSTRACT

The switching of upper and lower switching elements is controlled by respective upper and lower arm driving circuits. Those switching elements are connected in series across a primary d.c. power source and their successive switching generates a drive voltage which is applied to a load. A secondary d.c. power source is connected to the lower arm driving circuit while the upper arm driving circuit is connected to a capacitor connected to the high potential side of the primary d.c. power source. The capacitor is charged from the secondary d.c. power source through a charging circuit. This driving arrangement is particularly applicable to multi-phase driving circuits.

4 Claims, 7 Drawing Sheets

DRIVING CIRCUIT FOR A SWITCHING ELEMENT INCLUDING AN IMPROVED POWER SUPPLY ARRANGEMENT

This application is a continuation of application Ser. No. 405,233, filed on Sep. 11, 1989 now abandoned.

BACKGROUND OF THE INVENTION

1. Field of the Invention

The present invention relates to a driving circuit which may be formed as a semiconductor circuit for use in a power IC.

2. Summary of the Prior Art

It is known to form a bridge inverter for driving a load such as a motor by connecting in series two identical voltage-switching elements. Those switching elements are connected across a main d.c. voltage source, with the switching element connected to the high potential side of that source being referred to as an upper arm switching element and the switching element connected to the low potential side of the voltage source being referred to as a lower arm switching element. By switching those switching elements successively, a drive voltage may be generated at their point of interconnection, which drive voltage may be applied to the load.

To drive the upper arm switching element, it is necessary to apply a driving voltage between a control terminal, which controls the switching of the upper arm switching element, and the point of connection between the two switching elements. When the lower arm switching element is switched on, the potential of the point of interconnection between the switching elements drops to a level similar to the low potential side of the main d.c. voltage source. In a similar way, when the upper arm switching element is turned on, the potential of the connection of the two switching elements is similar to that of the high potential side of the main d.c. voltage source.

Hence, in order to drive the upper arm switching element, it is necessary to have a separate d.c. voltage source having a standard mid-point potential between the upper and the lower arms.

Consider now the case where it is desired to generate a polyphase signal to the load. In that case, each phase requires a corresponding pair of upper and lower arm switching elements, and all the lower arms switching elements may be driven from a single power source. However, a separate D.C. insulated power source is required to drive each upper arm switching element, which makes the resulting circuit complex and expensive.

In order to try to resolve this problem, it has been suggested in the Official Gazette of Japanese Patent Laid-Open No. 60-70980 to provide a capacitor and a diode for each phase of the inverter, to formulate a voltage source for driving the upper arm switching elements. The capacitors are charged from a common voltage source.

However, even in this arrangement, one capacitor and one diode must be provided for each phase. Therefore, there is still a limit on the simplicity of the circuit needed. Furthermore, in order to charge the capacitors, it is necessary for the lower arm switching element of the corresponding phase first to have been turned on, so that a current can flow from the power source, through the diode capacitor and lower arm switching element in order for the capacitors to be charged. Therefore, the switching of the upper arm switching element is not independent of the switching of the lower arm switching element and this causes problems at the start-up of the driving circuit since the upper arm switching elements cannot be operated until the lower switching arm elements have been operated. Furthermore, the voltage drop across the capacitor is affected when the lower arm switching element is turned on, and the prior art does not provide any method of compensating for firing the lower arm switching element. Thus, the charging of the capacitor depends on the potential of the interconnection of the two switching elements, which is not satisfactory.

A further disadvantage of the known system is that the driving power to the motor is affected by the power needed to charged the capacitor(s). Again, this is undesirable.

SUMMARY OF THE INVENTION

The present invention seeks to provide a driving circuit in which the switching of the upper arm switching element may be simplified, particularly but not exclusively in a polyphase circuit. The present invention proposes that a charge storage device (e.g. a capacitor) is connected to a high potential side of the primary D.C. power source, and that this charge storage device is used to drive the switching of the upper arm switching element. In order to charge the charge storage device, suitable charging means may be provided connected to a secondary D.C. power source.

As described above, the present invention originates in a desire to improve a driving circuit having a pair of switching elements connected in parallel across a primary D.C. power source. However, the present invention is also applicable to driving circuits having only one switching element.

Where the present invention is applied to a polyphase circuit, a corresponding plurality of upper arm switching elements may be provided, but all may be connected in common to the charge storage device.

In order to provide a way of controlling the turning on of the upper arm switching element, a first switching means may be provided between the charge storage device and the control terminal of that switching element. In a similar way, in order to turn off the upper arm switching element, a second switching means may be provided between the control terminal of that switching element and the low potential side of the main D.C. voltage source. Furthermore, in order to ensure that the upper arm switching element remains off, a third switching means and a suitable resistance may be provided between the control terminal and the upper arm switching element and the low potential side of the main D.C. power source.

It may be necessary to short-circuit the control terminal of the upper arm switching element and the output terminal of the driving circuit (the interconnection of the two switching elements where two such switching elements are provided), and this may be achieved by providing a fourth switching means therebetween. That short circuits the control terminal of the upper arm switching element and the output terminal when the voltage across the upper arm switching element becomes equal to or greater than a predetermined value. In this way, it becomes possible to limit the voltage across that switching element for safety purposes. A protective bi-directional voltage diode may also be provided in parallel to that for the switching means.

In the present invention, the charge storage device (capacitor) is charged by a suitable charging circuit which is powered from a secondary power source, which may be the driving power source for the lower arm switching element. Therefore, the capacitor can be charged independently of the operation of the lower arm switching element (and indeed independent of the operation of the upper arm switching element) so that the capacitor may supply a stable drive to the upper arm switching element. The upper arm switching element is turned on by control of the first switch between the high potential side of the capacitor and the control terminal of the upper arm switching element, and to turn off the upper arm switching element the first switch disconnects the capacitor from the control terminal, and the second switch connects the control terminal to the low voltage side of the main D.C. voltage source. This turns off the upper arm switching element, and the on-period of the second switching means may be shorter than the off-period, since all that is needed is a pulse to trigger the upper arm switching element.

When the upper arm switching element is off, a suitable circuit may be provided to protect the control terminal from the forward-biased voltage applied thereto. When the voltage of the interconnection of the two switching elements corresponds to the high potential side of the main D.C. voltage source, operation of the third switching means, in series with the second, connects the control terminal to the low potential side of the main D.C. voltage source through a resistance, so that the upper arm switching element is reverse biased. Equally, when the voltage of connection point is at a similar level to the low potential side of the main D.C. voltage source, a voltage detector connected between the high potential side of the main D.C. voltage source and the interconnection point causes turning on of the fourth switching means connected between the control terminal and the interconnection point, thereby short circuiting the control terminal to prevent erroneous firing of the upper arm switching element.

Two constant voltage diodes may be mounted in opposite directions between the control terminal and the interconnection point to prevent the application of an excessive voltage to the switching element.

Furthermore, a protection circuit may be provided for detecting the voltage across the capacitor and controlling the operation of at least the lower arm switching element independently of that voltage.

BRIEF DESCRIPTION OF THE DRAWINGS

Embodiments of the present invention will now be described in detail, by way of example, with reference to the accompanying drawings in which.

DETAILED DESCRIPTION

Figure 1:
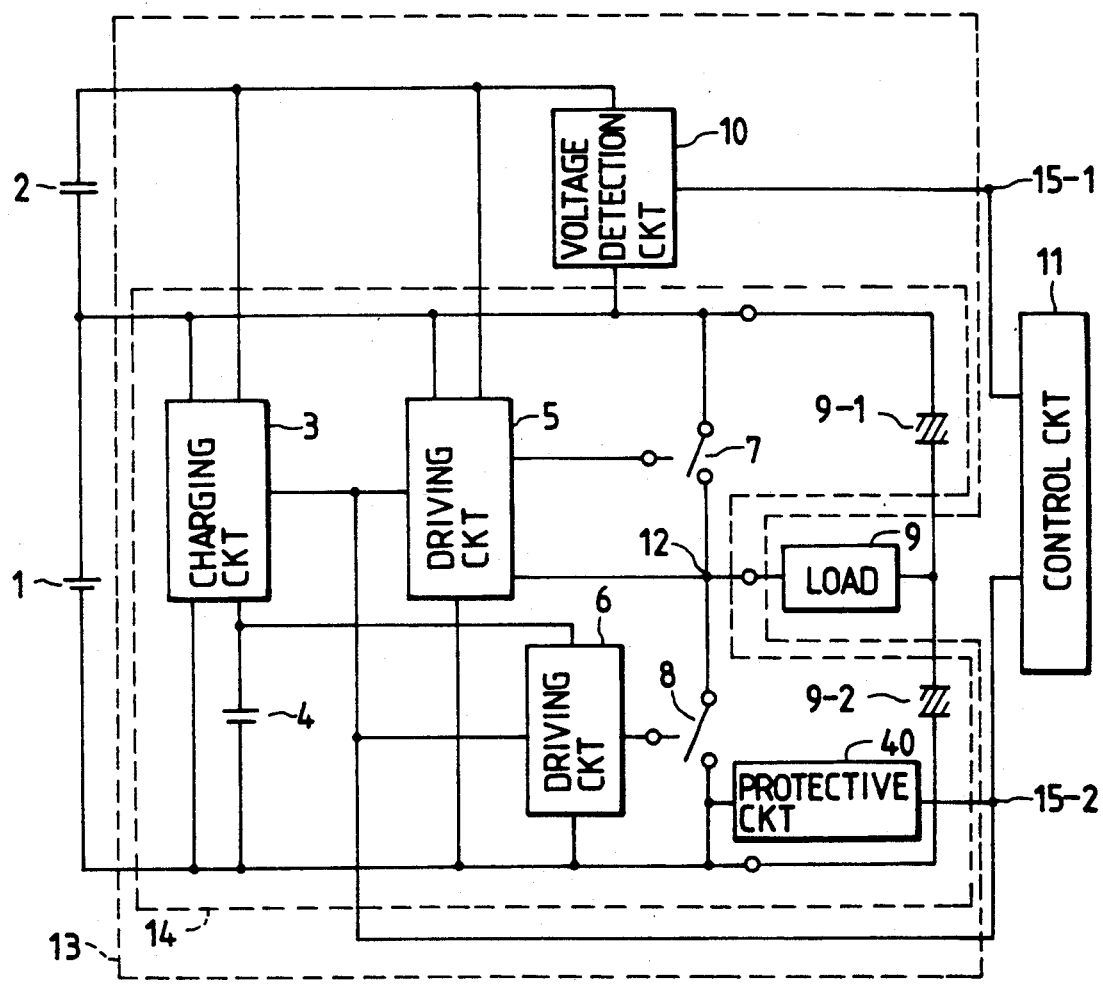
FIG. 1 shows a first embodiment of the present invention.

A first embodiment of the present invention will now be described with reference to FIG. 1. FIG. 1 shows a semiconductor driving circuit according to the invention with a first d.c. power source (primary voltage source) 1 with a voltage of E. The voltage source 1, an upper arm switching element 7 and a lower arm switching element 8 from a closed circuit with the latter two elements connected in series with the primary voltage source 1.

One side of a capacitor 2 is connected to the high potential side of the primary voltage source 1 to form a first charge storage means, and the other side of the capacitor 2 is connected to a capacitor charging circuit 3 and an upper arm driving circuit 5. The capacitor charging circuit 3 is connected to both sides of the primary voltage source 1 and the high potential side of a second D.C. power source (secondary voltage source) 4 whose voltage is Vcc. The upper arm driving circuit is connected to both sides of the primary voltage source 1, a control terminal arm switching element 7, and a mid-point potential contact 12. The lower arm driving circuit 6 is connected to both ends of the secondary voltage source 4 and a control terminal of the lower arm switching element 8. The lower potential side of the primary voltage source 1 is connected to that of the secondary voltage source 4, which is grounded in a manner that allows both sides to stay at the same potential.

A voltage detecting circuit 10 is connected to both ends of the capacitor 2 and supplied a detecting signal to a control circuit 11.

The control circuit 11 is connected to a voltage detecting circuit 10 and receives a status signal from that voltage detecting circuit 10. In response to the status signal, the control circuit 11 supplies a control signal to the capacitor charging circuit 3, the upper arm driving circuit 5, and the lower arm driving circuit 6.

One end of a load (e.g. a motor) is connected to a contact between the upper arm switching element 7 and the lower arm switching element 8, i.e. an output terminal provided at the mid-point potential contact 12. The other end of the load 9 is connected to a contact between two magnetic field capacitors 9-1 and 9-2, which are respectively connected in series to the high potential and low potential sides of the voltage source 1. The low potential side of the lower arm switching element 8 is connected to a protective circuit (surge current detector) 40. When a surge current is generated in the switching element 8 the surge current detector 40 transmits a surge current detecting signal to the control circuit 11. Then the control circuit 11 immediately supplies signals to the upper arm driving circuit 5 and the lower arm driving circuit 6 to stop the drive of the switching elements 7 and 8. Furthermore it supplies a charging signal to the capacitor charging circuit 3 so that the capacitor 2 is continuously charged. In this embodiment, the surge current detector 40 is provided only for the lower arm switching element 8 side, but a further detector may also be provided at the upper arm switching element 7.

The operation of the first embodiment of the present invention will now be discussed. The capacitor charging circuit 3 switches on and off a switch contained inside the circuit in response to a signal from the control circuit 11 such that the capacitor 2 is charged by the secondary voltage source 4. When the voltage of the capacitor 2 becomes equal to or more than the lower limit value which allows the switching element 7 to be driven, the voltage detecting circuit 10 charges to allow the control circuit 11 to output a signal. The control circuit 11 receives a signal from the voltage detecting circuit 10 and outputs a driving signal to the upper arm driving circuit 6. As a result, a voltage is applied to the mid-point voltage contact 12, i.e. to the load 9 to alternately switch between two circuit states, namely the on-state of the upper arm switching element 7 and the on-state of the lower arm switching element 8.

The charging capacitors 9-1 and 9-2 stabilize the voltage to be applied to the load 9. When the surge current detecting circuit 40 detects in excessive current, it immediately stops the operation of switching elements 7 and 8. The control circuit 11 controls the frequency and on-period of the driving signal.

If this embodiment is used for a half-bridge inverter, the switching element driving power source need use only the secondary voltage source 4 only, since the capacitor 2 and the capicitor charging circuit 3 drive the upper arm switching element 7. Furthermore, the capacitor charging circuit 3 can operate independently of the operating states of the upper arm switching element 7 and the lower arm switching element 8, so it does not influence the load 9. At start up since the voltage of the capacitor 2 is zero, the upper arm switching element 7 cannot be driven until the capacitor voltage rises to the required voltage. However, the voltage detecting circuit 10 and a means for outputting the detecting signal to the control circuit 11 enable the upper arm side switching element to start driving when the capacitor voltage rises to the required voltage.

Figure 2:
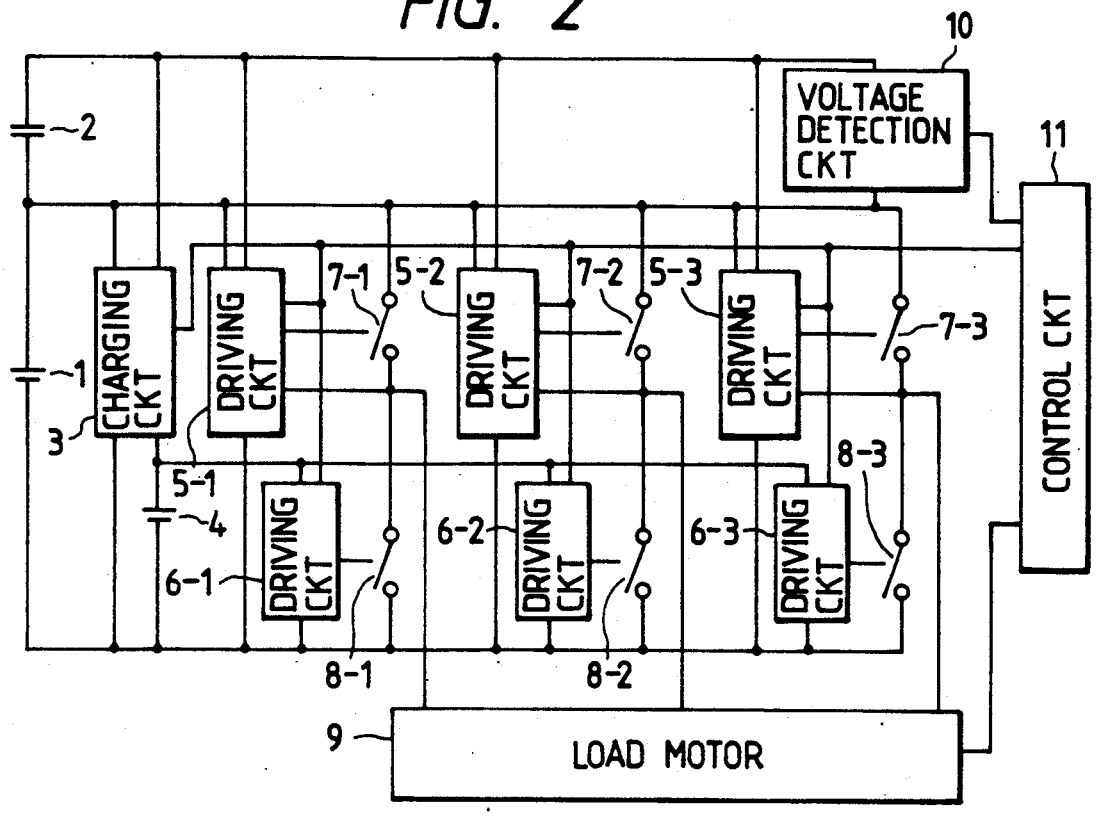
FIG. 2 shows a second embodiment of the present invention.

FIG. 2 shows a second embodiment wherein the present invention is used to form a three-phase full-bridge inverter for driving a three phase motor 9. The second embodiment differs from the first embodiment in that driving circuits are required for main switches to operate three upper arm switching elements 7-1, 7-2, and 7-3 (each corresponding to the upper arm switching element 7 of FIG. 1) and three lower arm switching elements 8-1, 8-2, and 8-3, (each corresponding to the lower arm switching element 8 of FIG. 1). There are also three upper arm driving circuits 5-1, 5-2, and 5-3 and three lower arm driving circuits 6-1, 6-2, and 6-3. The operation of the circuit is not described since it conforms to the first embodiment. The feature of this embodiment is that the capacitor 2 is a common power source for the three upper arm side switching elements 7-1, 7-2, and 7-3. This arrangement makes it possible greatly to reduce the number of parts, because it is possible to eliminate separate driving power sources to drive the upper arm side switching elements 7-1, 7-2m and 7-3.

Figure 3:
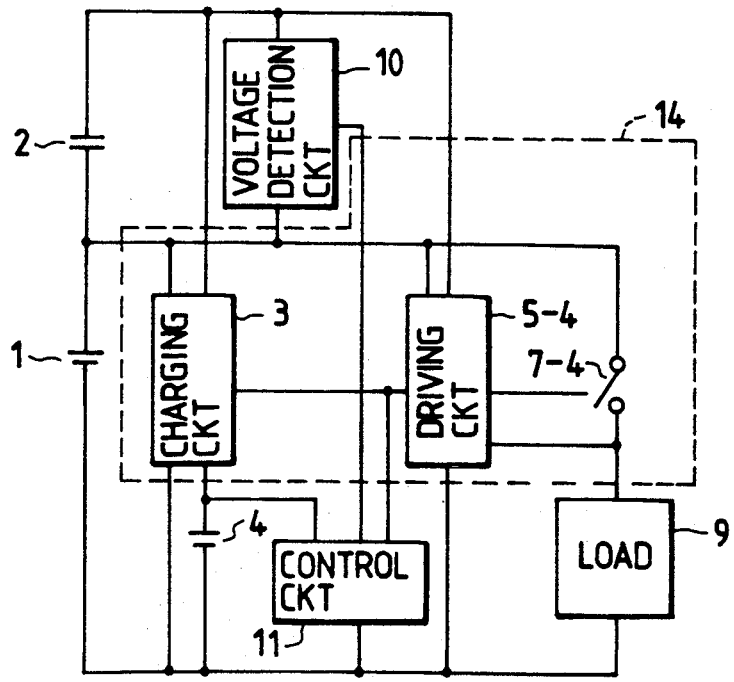
FIG. 3 shows a third embodiment of the present invention.

FIG. 3 shows a third embodiment of the present invention wherein the present invention is applied to a high-side switch.

In FIG. 3, a primary voltage source 1, a capacitor 2, a secondary voltage source 4, a capacitor charging circuit 3, and a voltage detecting circuit 10 respectively have the same arrangement as in FIG. 1. FIG. 3 shows the driving circuit 5-4 for a switching element 7-4. A load 9, the voltage source, 1 and the switching element 7-4 compose a closed circuit. The switching element 7-4 is a high-side switch located at the high potential side of the load 9. The control circuit 11 is driven by the secondary voltage source 4 and is connected to the voltage detecting circuit 10, the capacitor charging circuit 3, and the driving circuit 5-4.

Next the operation of the embodiment will be described. That operation is very similar to that shown in FIG. 1. First, the capacitor charging circuit 3 charges the capacitor 2 using the secondary voltage source 4. When the voltage of the capacitor 2 becomes equal to or more than the allowable lower limit value, the voltage detecting circuit 10 supplies a signal to the control circuit 11. Then, the control circuit 11 supplies a signal to drive the switching element 7-4 to the driving circuit 5-4.

In this third embodiment the control circuit 11, the load 9, and the ground potential employ a common voltage source (the secondary voltage source 4) as the power source for the control circuit 11 and for charging the capacitor 2. This means that the embodiment makes it possible to employ a common power source as the control power source and switching element driving power source, so as to reduce the number of parts. The third embodiment differs from the first embodiment in that there is no lower arm switching element, but only a single switching element 7-4.

Figure 4:
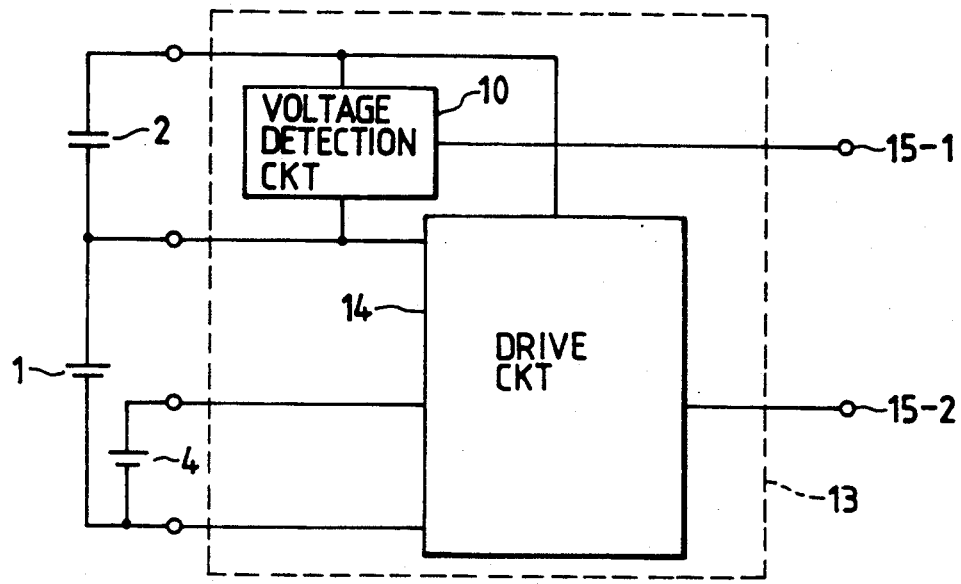
FIG. 4 shows a fourth embodiment of the present invention.

FIG. 4 shows a fourth embodiment of the invention. In this embodiment, all the components of the circuit bonded by dotted line 13 are formed on a single semiconductor chip. That chip is connected to a voltage source 1 whose voltage is E and a voltage source 3 whose voltage is Vcc. Inside the semiconductor circuit 13 are a main semiconductor driving circuit and a voltage detecting circuit 10. The main semiconductor driving may include the corresponding components indicated in FIG. 1 or in FIG. 3 (depending on whether there are two switching elements or only one), and thus may have a charging circuit for a capacitor 2, a switching element, a driving circuit for thw switching element, etc. as in FIG. 1 or FIG. 3. The semiconductor circuit 13 is connected to the primary voltage source 1, the secondary voltage source 4 and the capacitor 2 through terminals. The voltage detecting circuit 10 and the main semiconductor driving circuit 14 respectively supply the external terminals 15-1 and 15-3. The semiconductor circuit 13 also provides an external terminal to be connected to a load.

The operation of the arrangement shown in FIG. 3 is described with reference to FIG. 4. The main semiconductor driving circuit 14 includes a charging circuit for the capacitor 2, which uses charges from the secondary voltage source 4 for charging the capacitor 2. When the capacitor 2 is charged to a higher voltage than the required value, the circuit outputs a signal to the terminal 15-1. The control circuit (not shown in FIG. 4) of the semiconductor circuit 13 connected to the external source supplies a control signal to the main semiconductor driving circuit 14 through the terminal 15-2 in response to the signal from the terminal 15-1. The main semiconductor driving circuit 14 switches on and off the switching element(s) to allow a voltage to be applied to the load through the output terminal.

In the embodiment shown in FIG. 4 the circuit for detecting the level of the capacitor 2 voltage and the terminal 15-1 for transmitting that level to the exterior make it possible to prevent the main semiconductor driving circuit 14 from operating abnormally, such as increasing the on-resistance of a main resistor resulting from lack of voltage of the capacitor 2 for driving the semiconductor main driving circuit 14.

Figure 5:
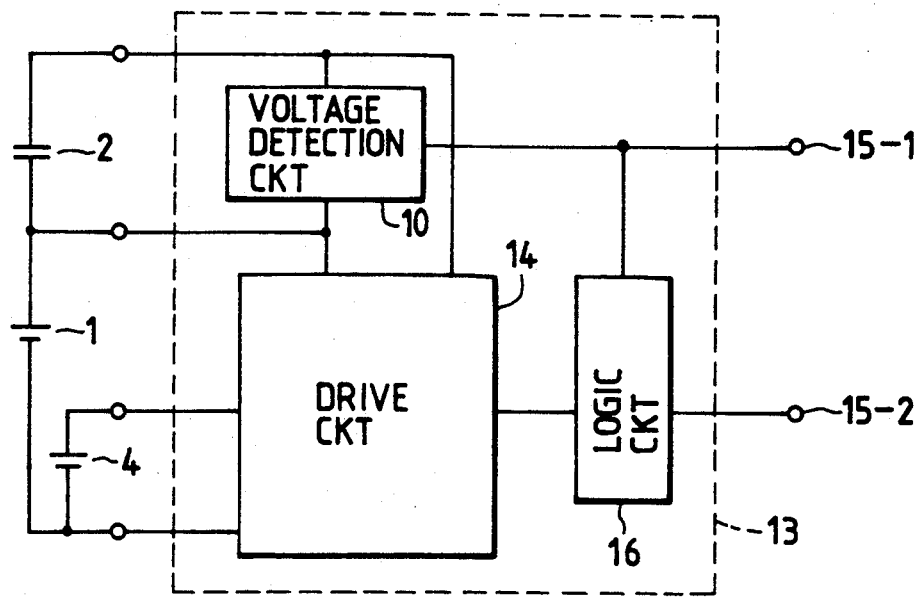
FIG. 5 shows a fifth embodiment of the present invention.

FIG. 5 shows a fifth embodiment of the present invention. The arrangement and circuit operation of this embodiment are basically similar to that of the embodiment shown in FIG. 4 and detailed description of the components which are common to the embodiments of FIGS. 4 and 5 will be omitted. In FIG. 5, a logic circuit 16 is connected to the terminal 15-1 interposed between the voltage detecting circuit 10 and the exterior and to the terminal 15-2 for transmitting a control signal to the one-chip semiconductor circuit 13. The logic circuit 16 is also connected to the semiconductor main driving circuit 14. This circuit arrangement allows the logic circuit 16 to screen the control signal sent from the terminal 15-2 to the semiconductor main driving circuit 14 until the voltage of capacitor 2 becomes equal to or more than a given value.

By adding the logic circuit 16, it is possible for the circuit to self-diagnose the lack of a driving voltage for the switching element from the capacitor 2 for the main semiconductor driving circuit 14 or to protect the switching element.

Figure 6:
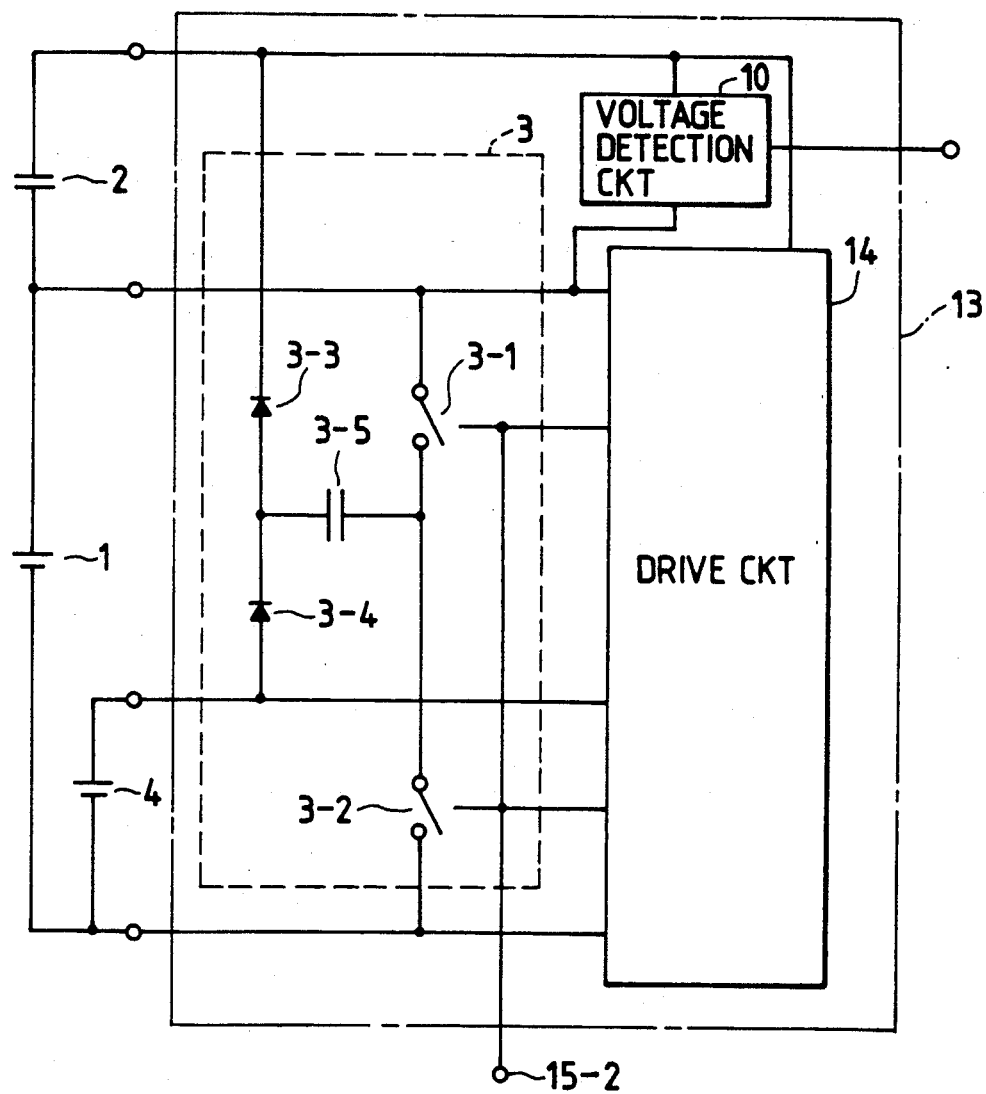
FIG. 6 shows a detailed circuit arrangement of the capacitor charging circuit for use in embodiments of the present invention.

FIG. 6 shows a detailed circuit arrangement for the capacitor changing circuit 3 for use in embodiments according to the invention.

As shown in FIG. 6, the one-chip semiconductor circuit 13, is connected to the primary voltage source 1, the secondary voltage source 4 and the capacitor 2. Inside the semiconductor circuit 13 are a main semiconductor driving circuit 14 as shown in FIG. 4 but in FIG. 6, circuit 14 excludes the capacitor charging circuit, and a separate capacitor charging circuit 3 is shown. These circuits have the same connections as described in the previous embodiments.

The capacitor charging circuit 3 comprises switches 3-1, 3-2, diodes 3-3, 3-4, and a capacitor 3-5. A closed circuit is formed such as to allow the high potential side terminal of the primary voltage source 1 to be connected in series to switches 3-1 and 3-2 and the switch 3-2 to be connected to the low potential side of the primary voltage source 1. Then, diodes 3-4 and 3-3 are connected in series between the high potential side of the secondary voltage source 4 and that of the primary voltage source 1 to allow the capacitor 2 to direct its high potential to a cathode electrode. One side of tha capacitor 3-5 is connected to a contact between the diodes 3-4 and 3-3 and the other end is connected to a contact between switches 3-1 and 3-2. In response to a signal sent from the external terminal 15-2, the switches 3-1 and 3-2 are repeatedly and alternately turned on and off.

Due to the two alternating circuit states discussed below, the capacitor charging circuit 3 moves charges from the secondary voltage source 4 to the capacitor 2. When the switch 3-2 is switched on, the secondary voltage source 4, the diode 3-4, the capacitor 3-5, and the switch 3-2 form a closed circuit. Current flowing from the voltage source 4 to the capacitor 3-5 enables the capacitor 3-5 to be charged.

Then, bu turning off switch 3-2 and on switch 3-1, the cpacitor 3-5, the diode 3-3, the capacitor 2, and the switch 3-1 from a closed circuit which causes current to flow in the order described, thereby transferring charges in the capacitor 3-5 into the capacitor 2 to charge it.

The capacitor 2 can be discharged by repeatedly alternating the two circuit states stated above.

It may be necessary to include a level shift circuit for driving the switch 3-1. Therefore, FIG. 7 shows an embodiment wherein a level shift circuit is added to the embodiment shown in FIG. 6.

Figure 7:
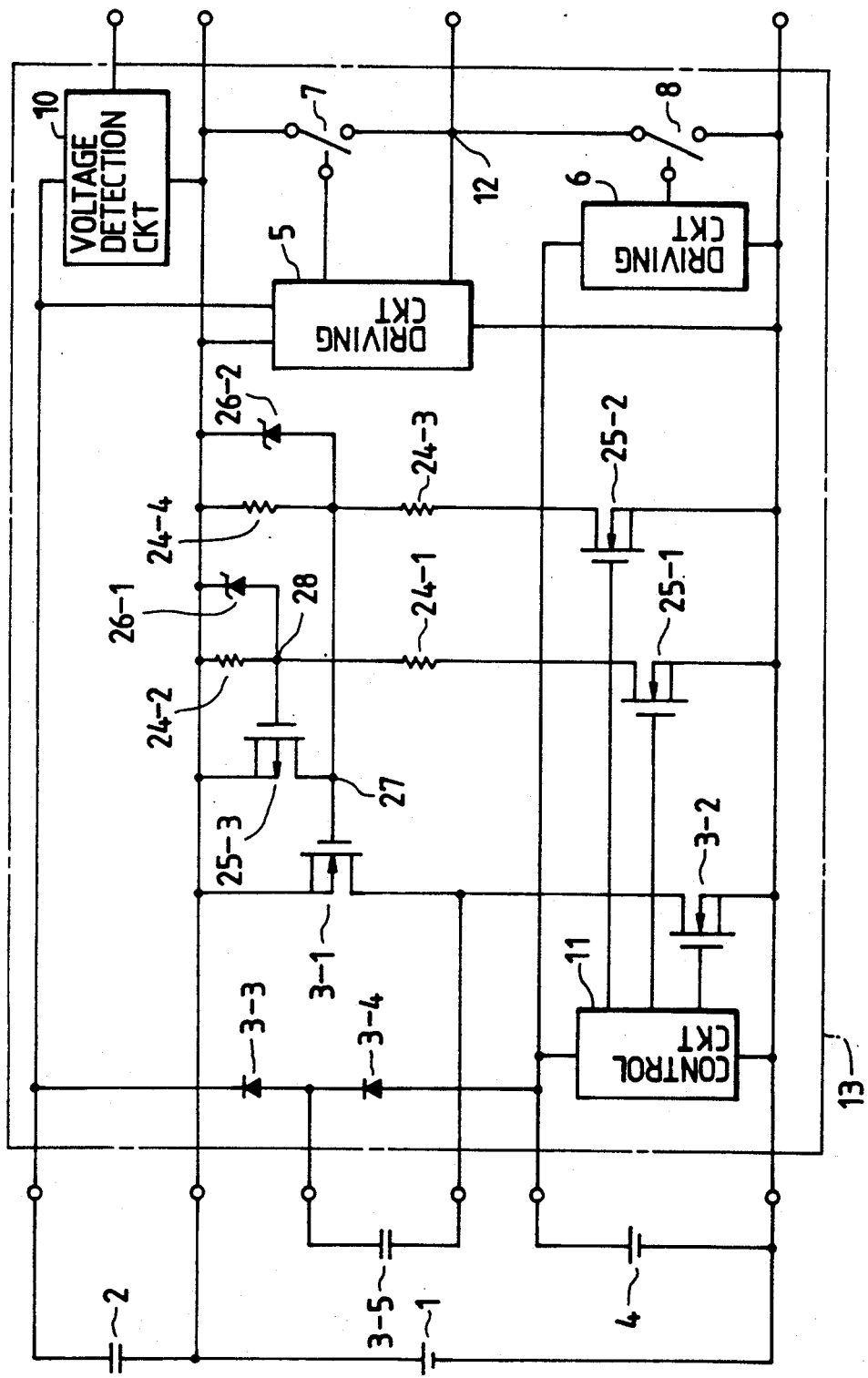
FIG. 7 shows a variation of the circuit of FIG. 6, having a level shift circuit.

The basic arrangement and circuit operation shown in FIG. 7 are the same as those in FIG. 6, and their descriptions are omitted. Hence, only the arrangement and operation of the level shift circuit will be described.

Between the control terminal 27 of the switch 3-1 and the high potential side of the voltage source 1 are connected a constant voltage diode 26-2, a resistor 24-4, and a MOSFET 25-3. A resistor 24-3 and MOSFET 25-2 are connected in series between the resistor 24-4 and the MOSFET 25-3. A resistor 24-2 and a constant voltage diode 26-1 are connected in parallel between a control terminal 28 of the MOSFET 25-3 and the high potential side of the voltage source 1. A resistor 24-1 and a MOSFET 25-1 are connected in series between the control terminal 28 and the low potential side of the voltage source.

Next, the operation of the circuit of FIG. 7 will be described. Since the switch 3-1 is a p-channel type MOSFET, in order to turn on this switch 3-1 it is necessary to switch on the MOSFET 25-2 and to apply a voltage that is separate from the primary voltage source 1 through the resistors 24-3 and 24-4 between the high potential side of the primary voltage source 1 and the terminal 27. To quench the switch 3-1, it is necessary to switch off the MOSFET 25-2 and switch on the MOSFET 25-1, fire the MOSFET 25-3 with a voltage drop caused by resistor 24-2, short circuit the high potential side of the primary voltage source 1 with the terminal 27, and then to rapidly quench the switch 3-1. Constant voltage diodes 26-2 and 26-1 are connected reprectively between the terminal 27 and the high potential side of the primary voltage source 1 and between the terminal 28 and the primary voltage source 1.

The feature of this embodiment are as follows: the circuit is very simple since it comprises two diodes, two switches and one capacitor; the capacitor 3-5 provided outside the semiconductor circuit 13 as shown in FIG. 7 enables the semiconductor circuit to be formed on a single chip, so that the MOSFET, the resistors, the constant voltage diode, and the diode are integrated. Though the diode and MOSFET have some elements requiring voltage-proofing for the primary voltage source 1, the current flowing is far smaller than that flowing through the switching element 7 so the component areas may be small. Hence, this embodiment is appropriate for a circuit incorporating the upper arm driving circuit 5, the lower arm driving circuit 6, and the switching elements 7, 8 on one semiconductor substrate in particular a high-voltage-proof IC.

Figure 8:
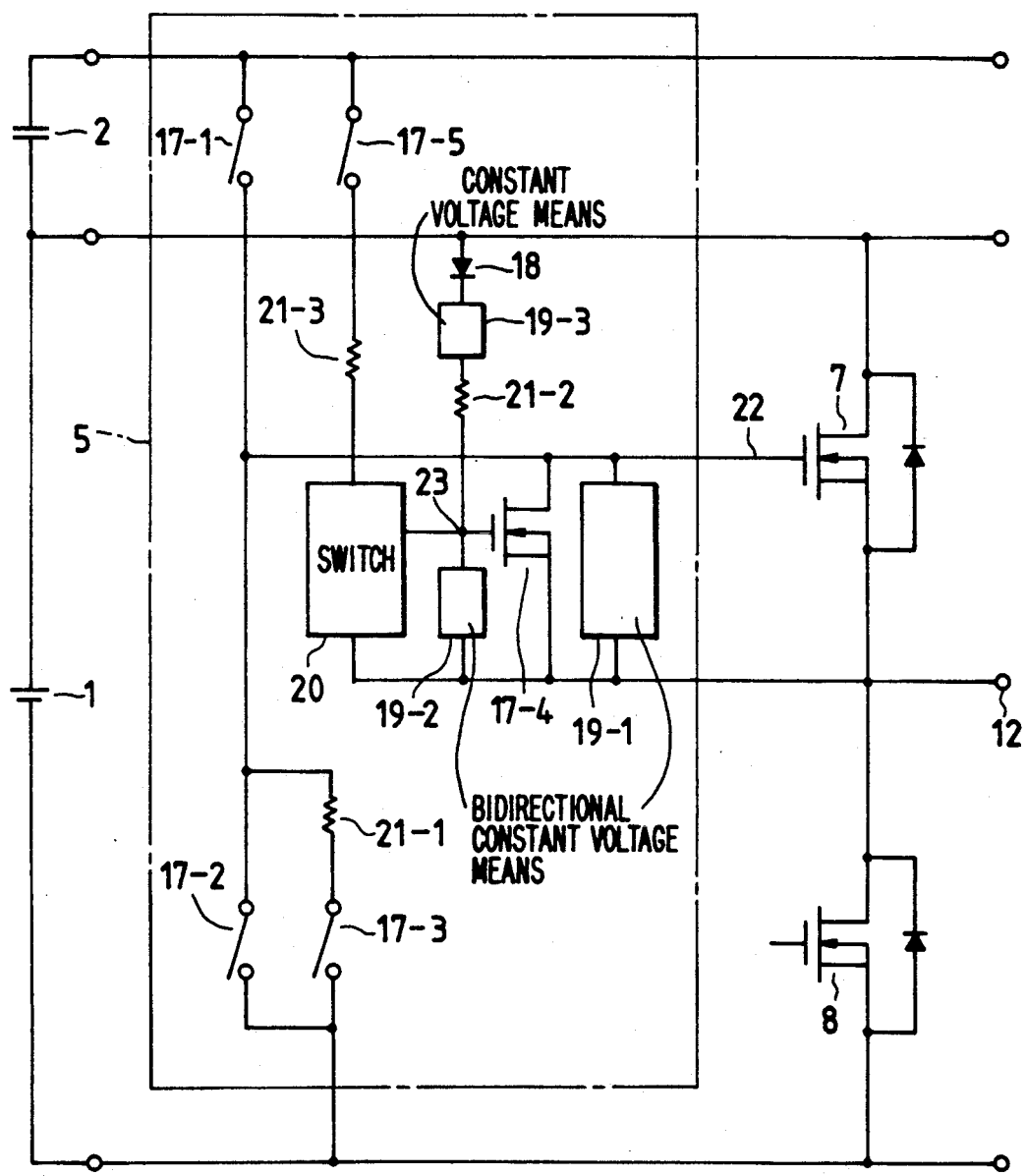
FIG. 8 shows a detail of a driving circuit for use in embodiments of the present invention.

FIG. 8 shows a detail of the driving circuit 5 of the switching element 7 at the high potential side of the voltage source included in the invention.

FIG. 8 shows the primary voltage source 1, a capacitor 2 an upper arm switching element 7 and a lower arm switching element 8. These units employ an n-channel type MOSFETs. These units do not need to be described since they have the same construction as those shown in FIG. 1. Next, reference will be made to the construction and operation of the driving circuit of the upper arm side switching element 7. A switch 17-1 is connected between the high potential side of the capacitor 2 and a control terminal 22 of the upper arm switching element 7. Connected in series between the control terminal 22 and the low potential side of the voltage source 1 are a switch 17-2, a resistor 21-1, and a switch 17-3. A bidirectional constant voltage means 19-1 and a switch 17-4 are connected between the control terminal 22 and the mid-point potential contact 12. The switch 17-4 employs an n-channel type MOSFET. A bidirectional constant voltage means 19-2 is connected between the constant terminal 23 of the switch 7-4 and the mid-point potential contact 12. Connected in series between the high potential side of the primary voltage source 1 and the control terminal 23 are a diode 18, a constant voltage means 19-3, and a resistor 21-2 of large resistance. Between the high potential side of the capacitor 2 and the midpoint voltage contact 12 are connected a resistor 21-3 and a switching means 20, one output terminal of which is connected to the control terminal 23.

Next, the operation of this arrangmenet will be described. The switches 17-1 and 17-5 must be turned onto fire the upper arm switching element 7, resulting in a current flowing through a closed circuit formed by the high potential side of the capacitor, the switch 17-1, the constant voltage means 19-1, the reverse-parallel diode of the upper arm switching element 7, and the low potential side of the capacitor 2 in that order. Hence, the current forward-biases the control terminal 22 and the mid-point potential contact 12 so that the upper arm switching element 7 is fired. On the other hand, when the upper arm switching element 7 is stored and the voltage applied is larger than a given value, the constant voltage means 19-3 remains in a conducting state, the current flowing through the resistor 21-2 serves to forward-bias a voltage between the control terminal 23 and the mid-point potential contact 12, switch 17-4 is turned on, and the control terminal 22 is short-circuited with the mid-point potential contact 12. To fire the upper arm side switching element 7, it is necessary to turn on the switches 17-5 and 17-1, operate the switching means 20, short circuit the control terminal 23 and the mid-point potential contact 12, and then turn off the switch 17-4.

To quench the upper arm side switching element 7, it is necessary to turn off the switches 17-1 and 17-5 and turn on the switch 17-2. When the upper arm switching element 7 is fired, the mid-point potential contact 12 is at the same level as the high potential side of the voltage source 1. Hence, by turning off the switch 17-2, the current flows from the mid-point potential contact 12 to the reverse-parallel parasitic diode of the switch 17-4, rapidly turning off the upper arm switching element 7. This means that the period when the switch 17-2 is closed need only be the interval for discharging the gate capacitance of the upper arm switching element 7.

When the upper arm switching element 7 is quenched it cannot be fired in error if the mid-point potential contact 12 is subject to a dv/dt variation resulting from the change in state of the main circuit. When current flows as a result of the upper arm side reverse-parallel diode remaining on, the mid-point potential contact 12 is at a similar voltage level to the primary voltage source 1. Turning on the switch 17-3 therefore causes a microcurrent to flow through the constant voltage means 19-1 and the resistor 21-2 so as not to apply a forward-biased voltage to the upper arm switching element 7.

When the main current flows through the upper arm reverse-parallel diode, the mid-point potential contact 12 stays at a similar potential to the low potential side of the voltage source 1. Since the constant voltage means 19-3 is in a conducting state as stated above, the control terminal 22 is short-circuited with the mid-point potential contact 12 by forward-biasing the switch 17-4 so as not to apply a forward biased voltage on the upper arm switching element 7. Hence, the upper arm side switching element 7 is not fired erroneously when the mid-point potential contact 12 is subject to a dv-dt variation. The diode 18 is used to prevent reverse current.

In this arrangement the important feature is the firing the upper arm switching element 7 with the charges stored in the capacitor 2, turning on the switching 17-2, applying a reverse-biased voltage on the upper arm switching element 7, and rapidly quenching it. Moreover, it has an additional feature of stopping erroneous firing of the upper arm switching element 7 when the mid-point potential contact 12 is subject to a dv/dt variation. Though the circuit arrangement needs a high voltage-proof element as a switch, it can be integrated as shown in the embodiment in FIG. 7, and is appropriate for a high voltage-proof IC formed on a single substrate.

It is possible to employ an IGBT (Insulated Gate Bipolar Transistor) as a switching element instead of an n-channel type MOSFET.

In the embodiment shown in FIG. 8, it may be necessary to employ a level shift circuit similar to the embodiment shown in FIG. 7 to drive the switches 17-1 and 17-5.

Figure 9:
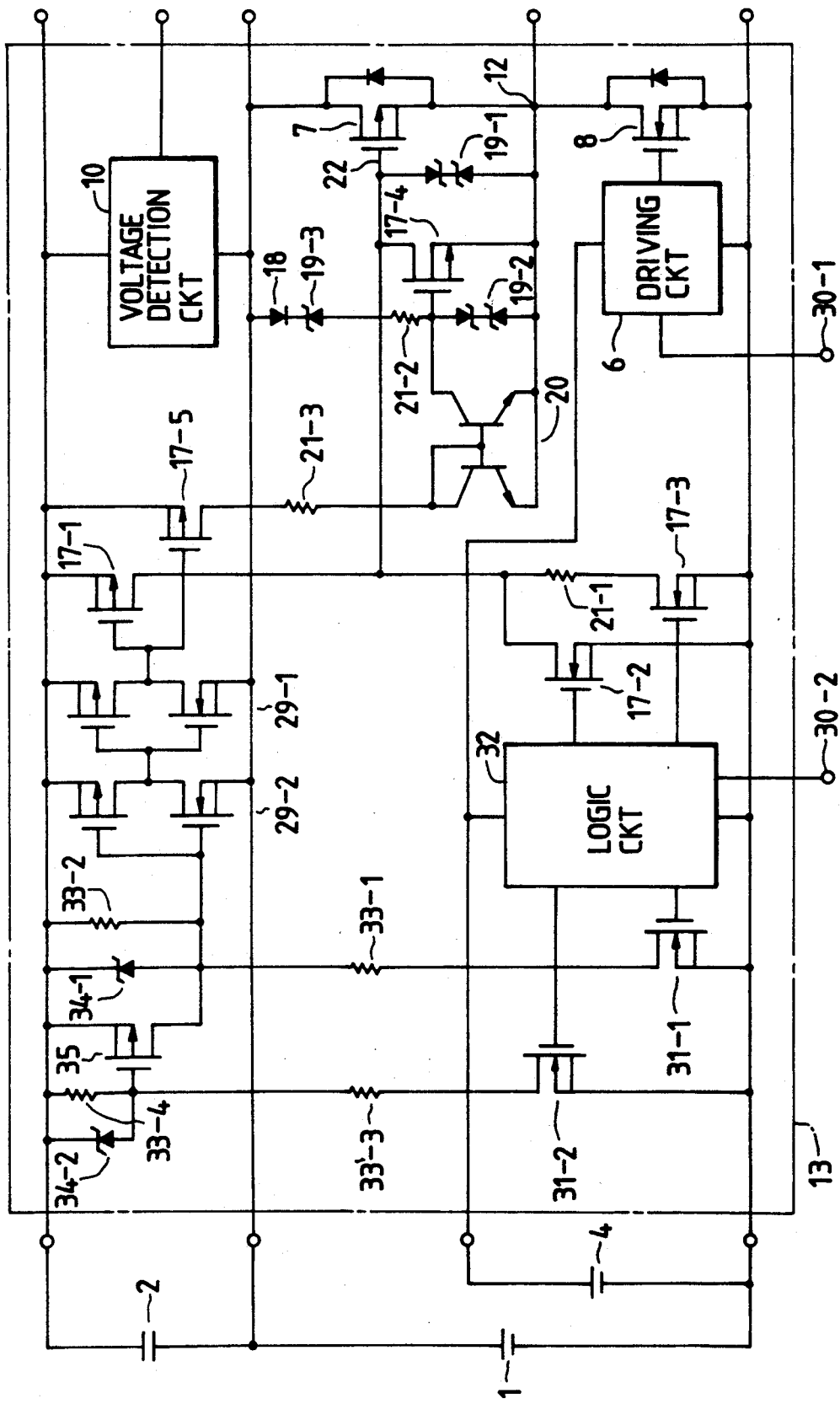
FIG. 9 shows a variation of the circuit of FIG. 8, including a level shift circuit.

FIG. 9 shows an arrangement wherein such a level shift circuit is added to the embodiment shown in FIG. 8.

The basic arrangement and operation of the arrangement shown in FIG. 9 are similar to those of the arrangement of FIG. 8 and their descriptions are omitted.

The level shift circuit comprises switches 31-1 and 31-2, resistors 33-1 to 33-4, constant voltage diodes 34-1 and 34-2, and a MOSFET 35. The aspects of the circuit that differ from the level shift circuit shown in FIG. 7 are that the potential at the high potential side conforms to that at the high potential side of the capacitor in FIG. 9, while also confirming to that at the high potential side of the primary voltage source 1 in FIG. 7, and that inverter circuits 29-1 and 29-2 are newly added. These inverter circuits 29-1 and 29-2 are used for wave shaping. The switches 31-1, 31-2 and 17-2, 17-3 are connected to a logic circuit 32. These switches are driven by a signal, which is the driving signal of the upper arm side switching element 7 of logic circuit 32. The signal is received at the terminal 30-2.

In addition, constant voltage diodes are replaced with the constant voltage means 19-1 to 19-3, and the switching circuit 20 employs a constant current mirror circuit composed of bipolar transistors.

The present invention makes it possible to employ a capacitance on the high potential side of a bridge inverted primary D.C. voltage source as a driving power source common to each phase of an upper arm side switching element, and thereby to reduce the number of components in the circuit.

Moreover, it is possible to charge the capacitor independently of the operation of the switching element and to supply a constant and stable voltage to a driving power source that is common to the upper arm side switching elements.

What is claimed is:
1. A driving circuit comprising:

a primary d.c. power source having a high potential side and a low potential side;

a switching element having a first terminal coupled to the high potential side primary d.c. power source and a second terminal for connection to a load;

a secondary d.c. power source having a high potential side and a low potential side, the low potential a side of which is coupled to the low potential side of said primary d.c. power source;

a charge storage device coupled to the high potential side of said primary d.c. power source;

means for charging said charge storage device using said secondary d.c. power source; and interconnection means interconnecting said charge storage device and said switching element for driving the switching of said switching element using charge stored in said charge storage device, wherein said switching element is a first switching element, wherein the driving circuit further includes a second switching element having a first terminal coupled to said second terminal of said first switching element and a second terminal coupled to the low potential side of said primary d.c. power source, and second means interconnecting said second switching element and said secondary d.c. power source for driving the switching of said second switching element, and wherein said driving circuit further includes a protective circuit for said second switching element, said protective circuit being arranged to detect the current through said second switching element.

2. A driving circuit comprising:

a primary d.c. power source having a high potential side and a low potential side;

a switching element having a first terminal coupled to the high potential side of said primary d.c. power source and a second terminal for connection to a load;

a secondary d.c. power having a high potential side and a low potential side, the low potential side of which is coupled to the low potential side of said primary d.c. power source;

a charge storage device coupled to the high potential side of said primary d.c. power source;

means for charging said charge storage device using said secondary d.c. power source; and interconnection means interconnecting said charge storage device and said switching element for driving the switching element using charge stored in said charge storage device, wherein said interconnection means includes a first switching means, wherein said switching element has a control terminal, and wherein said first switching means is coupled between said charge storage means and said control terminal, wherein said interconnection means has a second switching means, wherein said switching element has a control terminal, and wherein said second switching means is connected between said control terminal and the low potential side of said primary d.c. power source; and wherein said driving circuit comprises control means for controlling said second switching means, said control means being arranged to control said second switching means such that the on period of said second switching means is shorter than the off period thereof.

3. A driving circuit comprising:

a primary d.c. power source having a high potential side and a low potential side;

a switching element having a first terminal coupled to the high potential side of said primary d.c. power source and a second terminal for connection to a load;

a secondary d.c. power source having a high potential side and a low potential side, the low potential side of which is coupled to the low potential side of said primary d.c. power source;

a charge storage device coupled to the high potential side of said primary d.c. power source;

means for charging said charge storage device using said secondary d.c. power source; and interconnection means interconnecting said charge storage device and said switching element for driving the switching of said switching element using charge stored in said charge storage device, wherein said interconnection means has a second switching means, wherein said switching element has a control terminal, and wherein said second switching means is connected between said control terminal and the low potential side of said primary d.c. power source, wherein said interconnection means includes a third switching means and a resistance means coupled in series, wherein said switching element has a control terminal, and wherein said third switching means and said resistance means are coupled between said control terminal and the low potential side of said primary d.c. power source, wherein said switching element has a control terminal, and wherein a fourth switching means is coupled between said control terminal and said second terminal of said switching elements, wherein said means for charging said charge storage device includes:

fifth and sixth switching means coupled in series across said primary d.c. power supply;

a pair of diodes coupled in series between the high potential side of said secondary d.c. power supply and said charge storage device; and a second charge storage device coupled between an interconnection point of said diodes and an interconnection point of said fifth and sixth switching means, and wherein said fifth switching means has a control terminal, and wherein said driving circuit further includes means for controlling the switching of said fifth switching means comprising means for increasing a voltage difference between the high potential side of said primary d.c. power source and said control terminal, thereby to turn on said fourth switching means, and means to short-circuit the high potential side of said primary d.c. power source and said control terminal, thereby to turn off said fifth switching means.

4. A driving circuit comprising:

a primary d.c. power source having a high potential side and low potential side;

a switching element having a first terminal coupled to the high potential side of said primary d.c. power source and a second terminal for connection to a load;

a secondary d.c. source having a high potential side and a low potential side, the low potential side of which is coupled to the low potential side of said primary d.c. power source;

a charge storage device coupled to the high potential side of said primary d.c. power source, said charge storage device being arranged to drive the switching of said switching element; and voltage detecting means for detecting a voltage across said charge storage device, and further including a control circuit coupled to said voltage detecting means, said voltage detecting means being arranged to generate an output to said control means when said voltage across said charge storage device exceeds a predetermined value, and wherein said control means is arranged to cause said charge storage device to drive the switching of said switching element.

* * * * *